(12) United States Patent
Tompa

(10) Patent No.: US 7,985,295 B1
(45) Date of Patent: Jul. 26, 2011

(54) RF HEATER ARRANGEMENT FOR SUBSTRATE HEATING APPARATUS

(75) Inventor: Gary S. Tompa, Belle Mead, NJ (US)

(73) Assignee: Structured Materials Inc., Piscataway, NJ (US)

( * ) Notice: Subject to any disclaimer, the term of this patent is extended or adjusted under 35 U.S.C. 154(b) by 302 days.

(21) Appl. No.: 11/716,860

(22) Filed: Mar. 12, 2007

Related U.S. Application Data

(60) Provisional application No. 60/789,953, filed on Apr. 6, 2006.

(51) Int. Cl.
*C23C 16/00* (2006.01)
(52) U.S. Cl. ........................................................ 118/725
(58) Field of Classification Search .................. 118/725
See application file for complete search history.

(56) References Cited

U.S. PATENT DOCUMENTS

| | | | | |
|---|---|---|---|---|
| 4,277,320 A * | 7/1981 | Beguwala et al. | ............ | 438/776 |
| 5,401,331 A * | 3/1995 | Ciszek | ............ | 136/261 |
| 6,031,211 A * | 2/2000 | Mailho et al. | ............ | 219/486 |
| 2003/0064225 A1* | 4/2003 | Ohashi et al. | ............ | 428/408 |
| 2003/0094451 A1* | 5/2003 | Hamaguchi | ............ | 219/635 |
| 2005/0000453 A1* | 1/2005 | Hwang et al. | ............ | 118/728 |
| 2005/0109461 A1* | 5/2005 | Sun | ............ | 156/345.37 |

* cited by examiner

*Primary Examiner* — Keath T Chen
(74) *Attorney, Agent, or Firm* — William L. Botjer

(57) ABSTRACT

An RF heating system for a substrate or substrates including a susceptor for supporting the substrate; one or more RF heating coils; and a platen disposed between the RF heating coil and the substrate. The platen is constructed of materials that become heated under RF energy, which will then radiate heat into the susceptor and the substrate. In this way the susceptor need not be constructed of materials that become heated under RF energy thus minimizing levitation. The platen provides a uniform temperature profile across the substrates, benefiting from a more diffused heat source. The RF heating system may also be utilized in CVD apparatus that deposits materials on a continuous tape or roll.

14 Claims, 7 Drawing Sheets

RF HEATER ARRANGEMENT FOR SUBSTRATE HEATING APPARATUS

REFERENCE TO RELATED APPLICATIONS

This application claims priority from U.S. provisional application Ser. No. 60/789,953 filed Apr. 6, 2006

BACKGROUND AND SUMMARY OF THE INVENTION

This application is directed to substrate heating apparatus within the preferred embodiment of Chemical Vapor Deposition (CVD) apparatus and more specifically to an improved arrangement for RF heating of the substrate in a deposition reactor.

Chemical Vapor Deposition (CVD) systems are widely used to deposit compositional and compound films in the manufacture of electronic devices, such as integrated circuits formed by the sequential or simultaneous deposition of compounds upon a heated substrate, which is usually in the form of a wafer that is typically mounted on a rotatable or non-rotatable susceptor. The reactants are transported to the surface in the gas phase by typically one or more carrier gases. The elements deposit on the wafer surface, forming the desired compound and the undesirable by-products are pumped away in a gaseous form. The wafers mounted on the susceptor with a heating element mounted below the susceptor to heat the wafers.

Conventionally the heating elements have been radiant (resistive) heating elements made of graphite or tungsten. Deposition of certain materials such as silicon carbide (SiC) semiconductor materials require wafer temperature levels as high as, or above, about 1500° in a hydrogen environment during long deposition runs, e.g., up to 6-8 through a few to several tens of hours. Conventional resistive heating elements, made of graphite or tungsten, cannot stably provide these temperature levels for prolonged periods of time. As a result, RF induction heating has been used when high temperature levels have to be provided in a non-inert environment. In such systems induction coils are operated to produce electric fields in the kilohertz to megahertz range. The RF fields induce eddy currents in the susceptor, which must be of a conducting/metallic material, which in turn heats the wafers.

However conventional induction heating systems are subject to a number of is problems which can lead to failure of the materials to be properly deposited on the substrates. A serious problem is a non uniform temperature profile across the substrates which is caused by factors including some or all of the following: non-uniform induced current heating (i.e. local hot or cold zones), variations in thermal radiation (i.e. sides versus top and bottom surfaces), and irregular configuration of the susceptor among others. These factors can cause an uneven deposition of the materials and/or a failure or certain materials to be deposited at all. Another problem is that conventional induction heating systems require that the susceptor be conductive (metallic) which can result in induced currents in the wafer, causing the mounted substrates to levitate away from the susceptor, or cause the susceptor to warp, again leading to uneven thermal contact to the wafer and thus uneven heating or even a tossing away of the wafer, and contamination directly to the depositing film from the outgassing of the metals/conductors being heated.

The present invention provides an improved RF heating system for a substrate or substrates including a susceptor for supporting the substrate; one or more RF heating coils; and a platen disposed between the RF heating coil and the substrate. The platen is constructed of materials that become heated under RF energy, which will then radiate heat into the susceptor and the substrate. In this way the susceptor need not be constructed of materials that become heated under RF energy thus minimizing levitation. Further, the susceptor may also be made of more inert, higher thermal conductivity, or purer materials, having beneficial properties not realizable from metal. Two such susceptor materials are diamond and alumina for maximum thermal conductivity in an RF headed susceptor-platen system for single or multiple wafers of 2" to 20" (or larger) diameter with the susceptor preferably of at least 0.040" thickness. The platen also provides a uniform temperature profile across the substrates, benefiting from a more diffused heat source. Additionally, the region around the directly RF heated platen can be independently purged to minimize any potential outgassing contaminants.

In a further embodiment the substrate comprises a continuous tape and the substrate supporting device comprises a stationary plate over which the tape passes. An induction heating coil is used to heat a metallic platen which is located under the stationary plate. The heat generated in the platen is radiated to the stationary plate. The stationary plate, as it is heated by radiated heat from the plate, not by eddy currents, can be either insulating or electrically grounded which provides an effective deposition process across a continuous tape, which if heated directly by the RF could not be grounded and thus all metal components in contact with it would become RF conducting.

DESCRIPTION OF THE PREFERRED EMBODIMENTS

Figure 1:
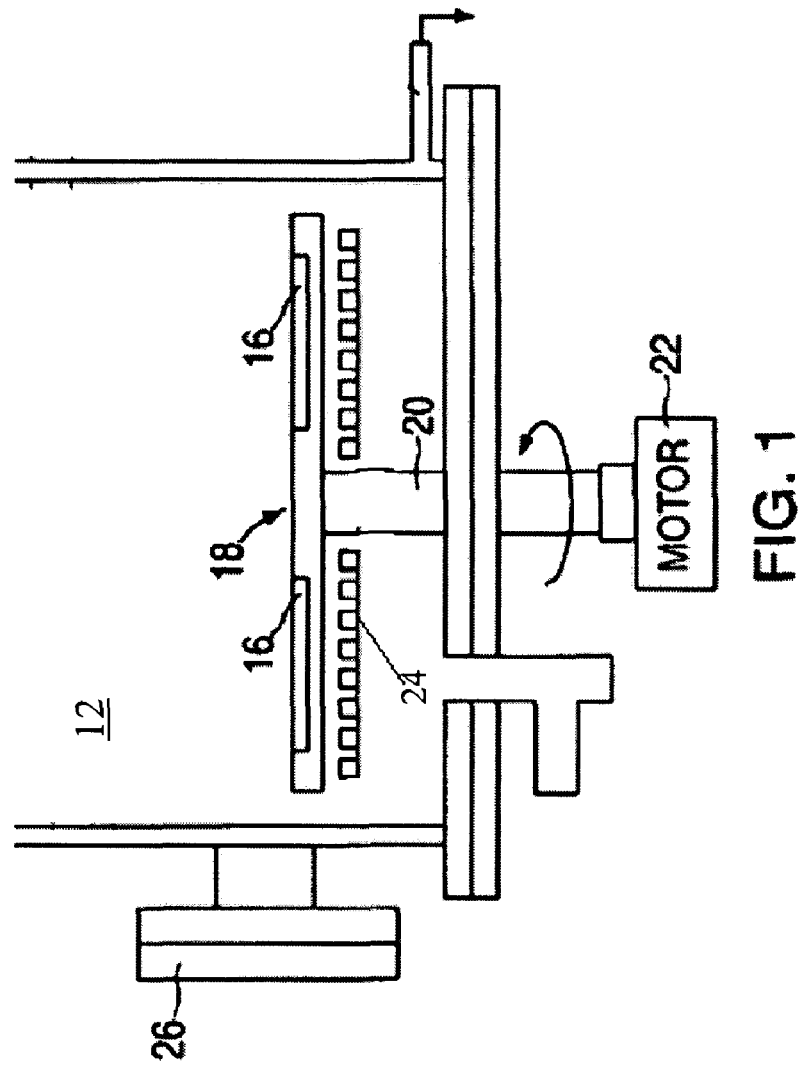
FIG. 1 illustrates a general overview of a Chemical Vapor Deposition (CVD) System.

FIG. 1 illustrates a Chemical Vapor Deposition (CVD) System 10 which, in general overview: includes a reactor chamber 12, sealed to the atmosphere, in which is mounted a distribution housing (a showerhead, which would be located at the top in this example—but is not shown herein) for the film growth reactant gases. The distribution housing directs the reactant gases over one or more substrate wafers 16, mounted, in this example, on a rotatable susceptor 18 which is rotated through a shaft 20 by a motor 22 mounted externally from reactor chamber 12, and which are to heated by a heater unit 24 which may be either a resistive heating element or an induction RF heating coil. In an RF heating system the magnetic field generated by the RF coil induces eddy currents in susceptor 18 which cause it to become heated along with the wafers mounted thereon. The reactant and carrier gases generated by external sources (not shown) are distributed though distribution housing 14 and flow over heated wafers 16 where the gases will decompose (react at the wafer surface) and deposit elemental or compound films. Thereafter an exhaust unit 26 will remove the spent gases from reactor chamber 12.

Figure 2:
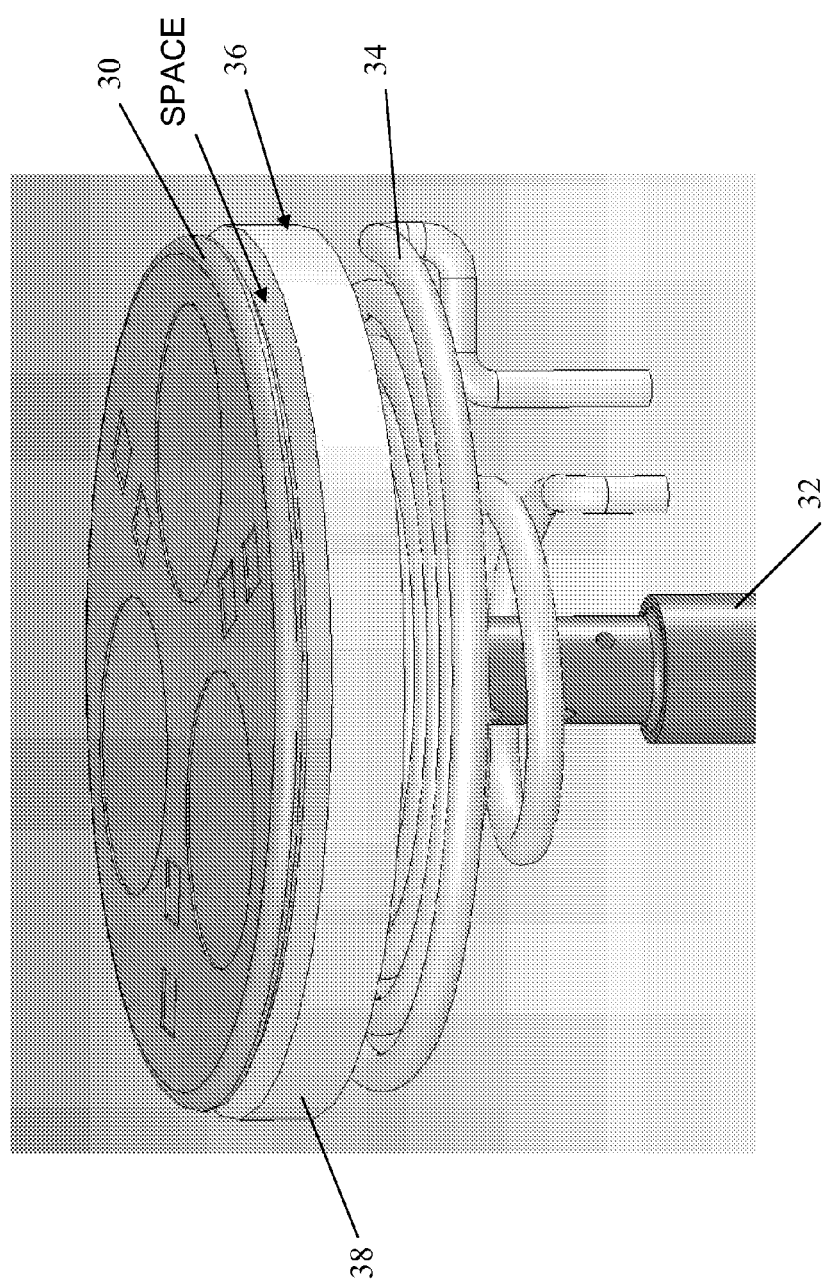
FIGS. 2 and 3 are perspective and sectional views of the CVD RF heating system of the present invention.
Figure 3:
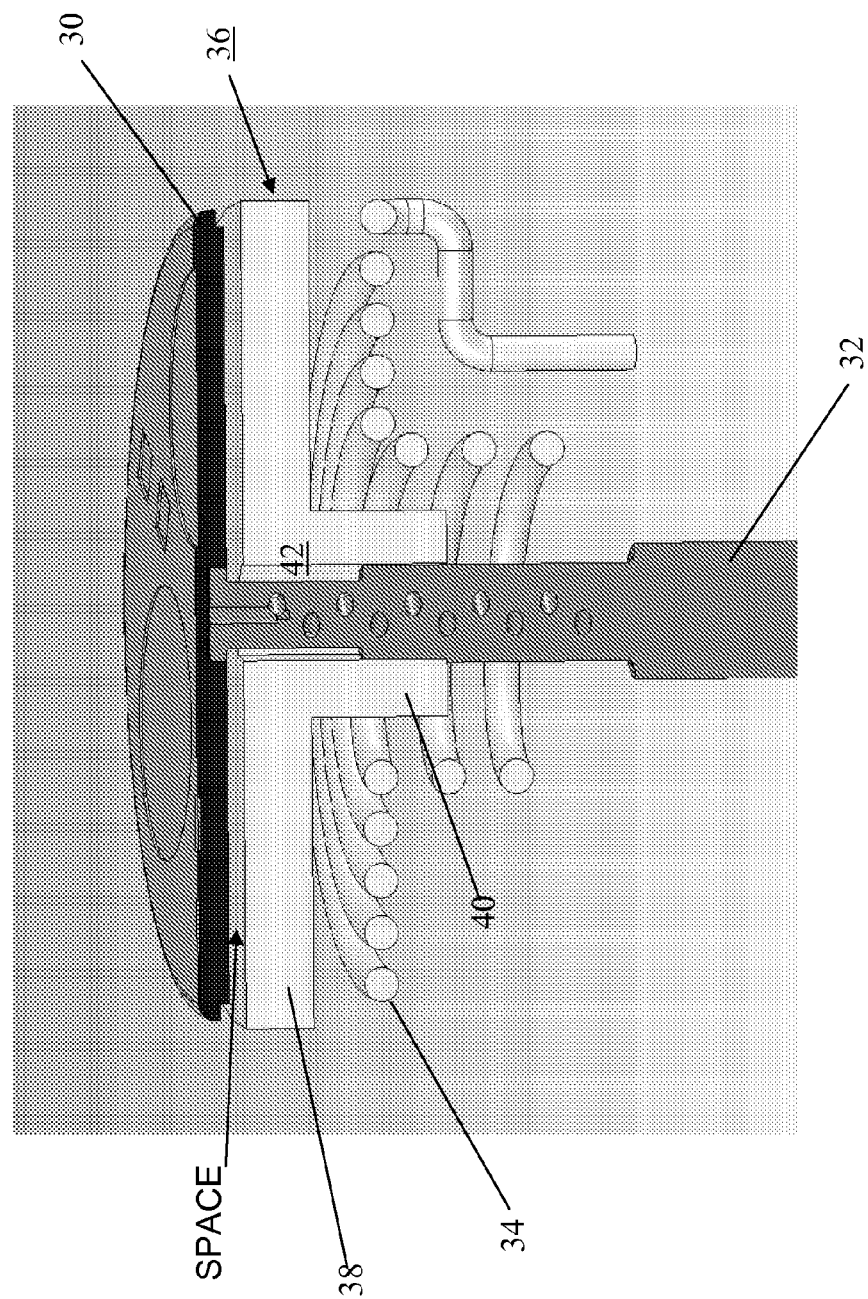

FIGS. 2 and 3 are perspective and sectional views of the CVD RF heating system of the present invention. The RF heating system includes a susceptor 30, upon which the wafers to be deposited on are mounted, which is joined to a rotating shaft 32 either by physical continuity, attachment or gravity. Surrounding shaft 32 is an RF coil 34 which may be of any conventional types used in CVD applications. Disposed intermediate susceptor 30 and RF coil 34 is a platen 36 which includes a generally circular horizontal portion 38 (see FIG. 3) located in proximity to susceptor 30 and a central collar 40 which includes an opening 42 through which shaft 32 passes. Platen 32 may be arranged so that it either does or does not rotate along with shaft 32 depending on the requirements of the user. Platen 32 is constructed of materials such as Tungsten, Molybdenum, inconel, Graphite (Carbon), Rhenium, Platinum, and the like that become heated by the RF fields generated by RF coil 34, this in turn will radiate heat into susceptor 30 and the substrates (wafers) mounted thereon. This arrangement greatly reduces any temperature non-uniformities, at the edges and center of susceptor 30, and eliminates the need for susceptor 30 to be constructed of a material that is heatable by the RF fields. While not shown, the wafer carrier outer edge could overhang, downwardly from the platen; thus allowing additional heat input to the wafer holder.

More specifically, by heating an intermediate platen, rather than the susceptor directly, non-uniformities in heating patterns are allowed to diffuse out. Susceptor 30 (wafer carrier) and or the wafer, if conductive, are less exposed to direct eddy currents which can levitate an unrestricted plate. The susceptor 30 material does not need to be electrically conductive and can be ceramic, such as by way of example only, Sapphire, SiC or Diamond. The remaining radiated heat non-uniformities can be averaged by the rotation of susceptor 30. In preferred embodiments platen 32 is part of a component system with the other parts of the CVD RF heating system so that different platens of different thickness', sizes and/or different materials may be substituted so as to change the thermal characteristics in accordance with the particular CVD deposition regime required by the materials to be deposited and the type of substrates used.

Figure 4:
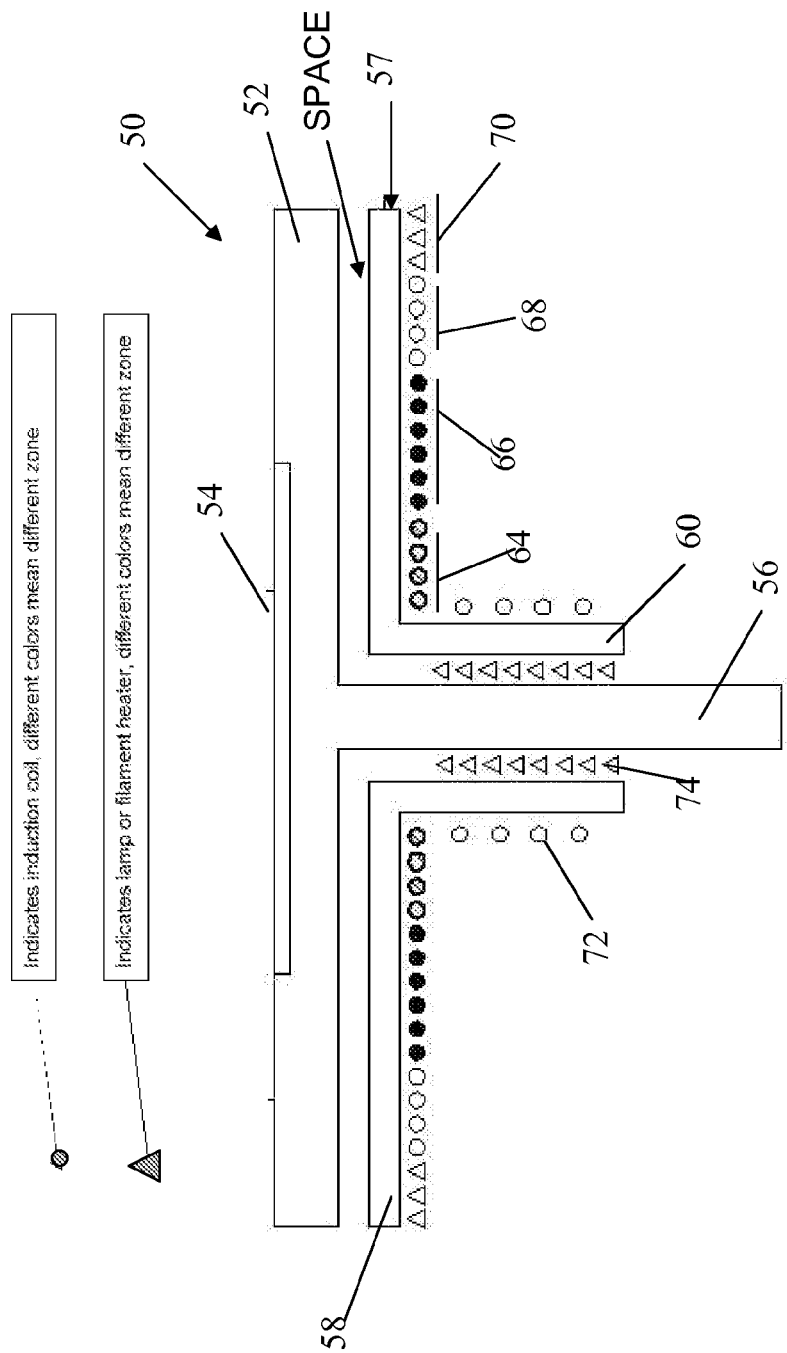
FIG. 4 illustrates a multiple zone RF heating system having RF and resistive is heaters.

The use of an intermediate platen in accordance with the present invention, as it provides a "smoothing out" of temperature variations on the susceptor, is particularly suitable for use in a "zoned" heating system wherein different RF coils having different heating characteristics are used. Similarly the platen 36 could also be physically separated into concentric or other sections to give different heating characteristics. The present invention is also suitable for use in a hybrid heating system wherein both RF (inductive) and resistive heating coils are used. FIG. 4 illustrates such a heating system 50 which includes a susceptor 52 mounting one or more substrates 54. A rotating shaft 56 serves to rotate susceptor 52. Disposed proximate to susceptor 52 is a platen 57 which includes a generally circular horizontal portion 58 located in proximity to susceptor 52 and a central collar 60 which includes an opening through which shaft 56 passes. Platen 57 may be arranged so that it either does or does not rotate along with shaft 56 depending on the requirements of the user. Platen 57 is constructed of materials that become heated by the RF fields, this in turn will radiate heat into susceptor 52 and the substrates 54 mounted thereon. In the case of a tape heater—the tape is equivalent to the wafer and is preferably passed continuously over the platen.

The arrangement of FIG. 4 includes a multiple zone RF heating system having resistive heaters as well. A first RF heating zone is formed by a first set of RF coils 64 disposed under platen 57 and closest to shaft 56. A second RF heating zone is formed by a second set of RF coils 66 disposed under platen 57 and further from shaft 56 and a third RF heating zone is formed by a third set of RF coils 68. A fourth set of resistive heating coils 70 is disposed along the periphery of platen 57. A fifth inductive coil set 72 acts upon collar portion 60 of platen 57 and a sixth resistive coil set 74 disposed between collar 62 and shaft 56 acts to heat shaft 56. Each coil set 64, 66, 68, 70 and 72 applies a different temperature to platen 57 which in turn heats susceptor 52 and substrates 54. Ordinarily the presence of multiple coil sets could cause undesirable temperature gradients in susceptor 52 and substrates 54, however the presence of platen 57 serves to smooth out the temperature gradients to provide an optimum temperature profile to substrates 54. The present invention may be used with as many or as few zones as required by the deposition process and with any mix of inductive and resistive heating elements.

Figure 5:
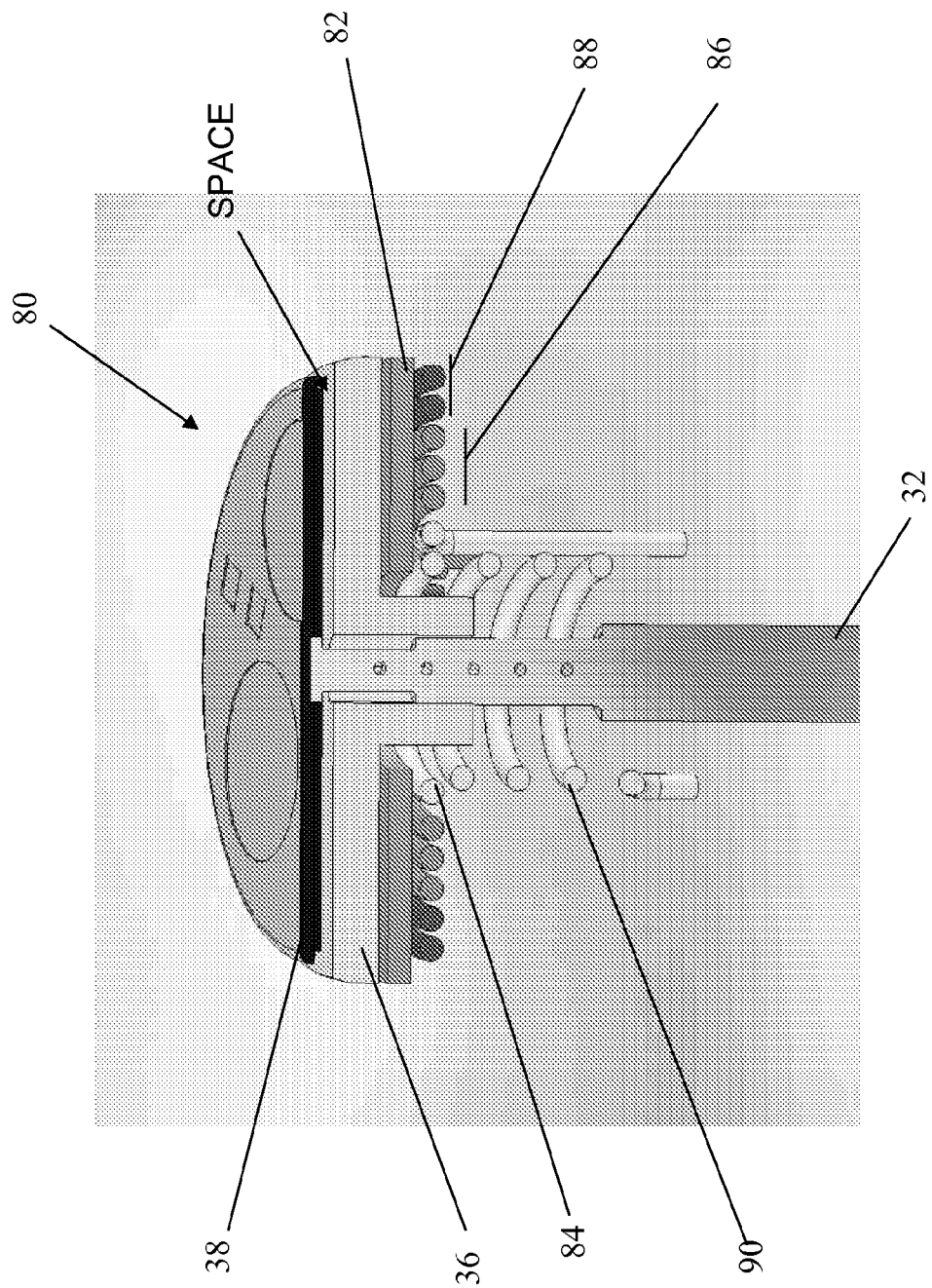
FIG. 5 is a sectional view of a CVD RF heating system constructed in accordance with a further embodiment of the present invention.

FIG. 5 is a sectional view of a CVD RF heating system 80 constructed in accordance with a further embodiment of the present invention, in FIG. 5 the same reference numbers are used to indicate the same structures as set out in FIGS. 2 and 3. RF heating system 80 includes an dielectric (insulating) annular plate 82 located between platen 36 and the RF induction coils. The purpose of dielectric plate 82 is to further interpose a heat barrier between the inductively heated platen 36 and the induction coils. Suitable materials for insulating dielectric plate 82 include insulating or very low conducting ceramic fiber blankets, ceramic sponges or ceramic solids with or without patterning In this figure the RF induction coils include an inner coil 84 located towards the center of platen 36, middle coils 86, outer coils 88 located at the periphery of platen 36, and shaft heating coils 90. RF coils 84, 86, 88 and 90 may be operated at different energy levels so as to provide a desired temperature profile across platen 36 and thus susceptor 38.

Figure 6:
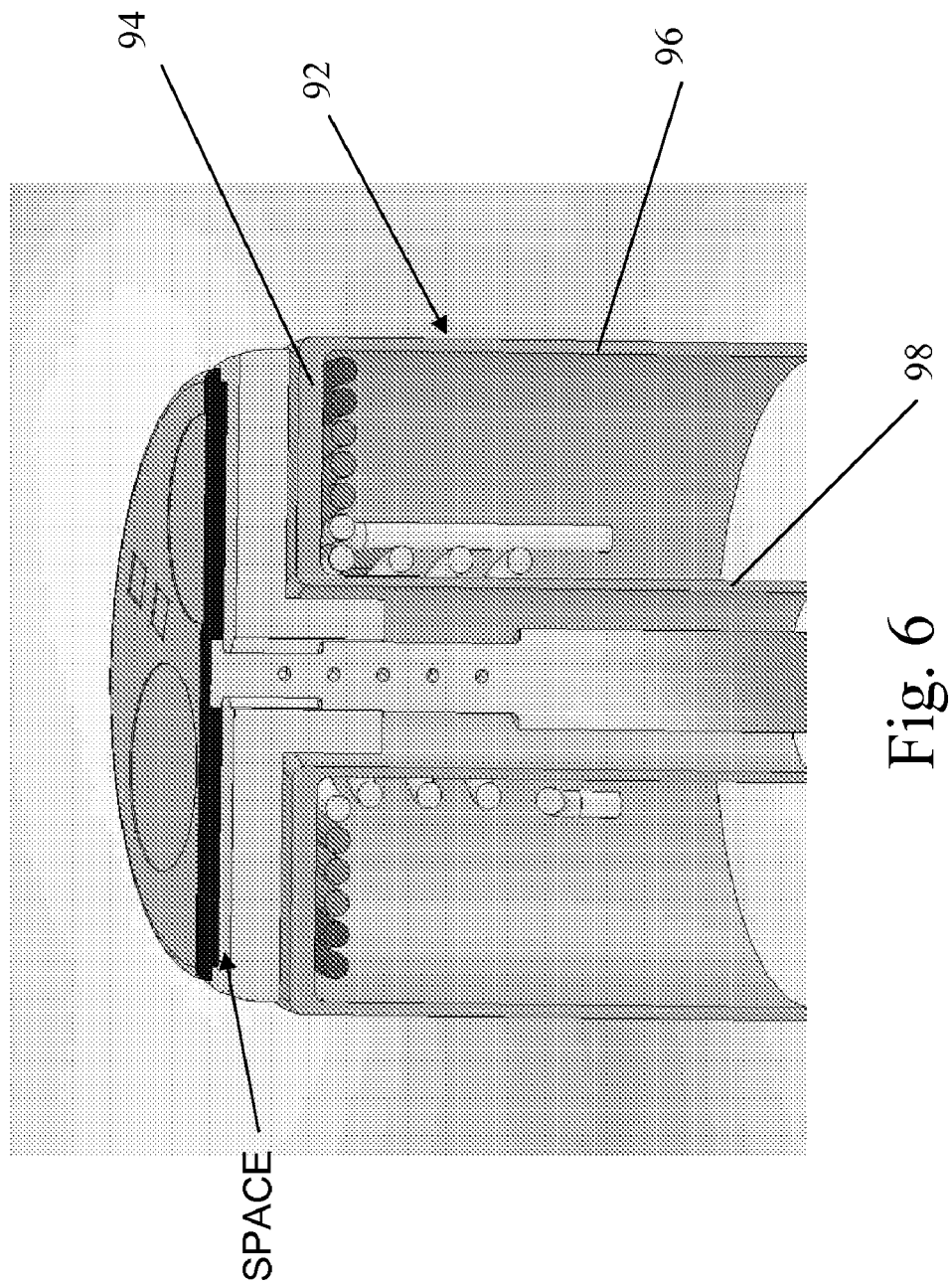
FIG. 6 is a sectional view of a CVD RF heating system constructed in accordance with a another embodiment of the present invention.

FIG. 6 is a sectional view of a CVD RF heating system 80 constructed in accordance with a another embodiment of the present invention, in FIG. 6 the same reference numbers are used to indicate the same structures as set out in FIG. 5. In FIG. 6 insulating dielectric annular plate 82 is replaced by a enclosing dielectric shroud 92 to further interpose a heat barrier between the inductively heated heat radiating platen and induction coils 84, 86 and 88. Shroud 92 includes an upper wall 94 located between platen 36 and coils 84, 86 and 88; an outer cylindrical wall 96 and an cylindrical inner wall 98 surrounding shaft 32. Alternatively walls 94, 96 and 98 shroud 92 may be double walled (i.e. hollow) with a coolant flow therebetween. Alternatively, shroud 92 itself can be used as the encapsulant for coolant flow that the RF coils may be submersed in. Further the bottom of shroud 92 may be sealed in such a way as to isolate the process gases from induction coils 84, 86 and 88 as well. Suitable materials for insulating shroud 92 include insulating or very low conducting ceramic fiber blankets, ceramic sponges or ceramic solids with or without patterning. One approach to provide coolant flow is to use a double walled quartz envelope.

Figure 7:
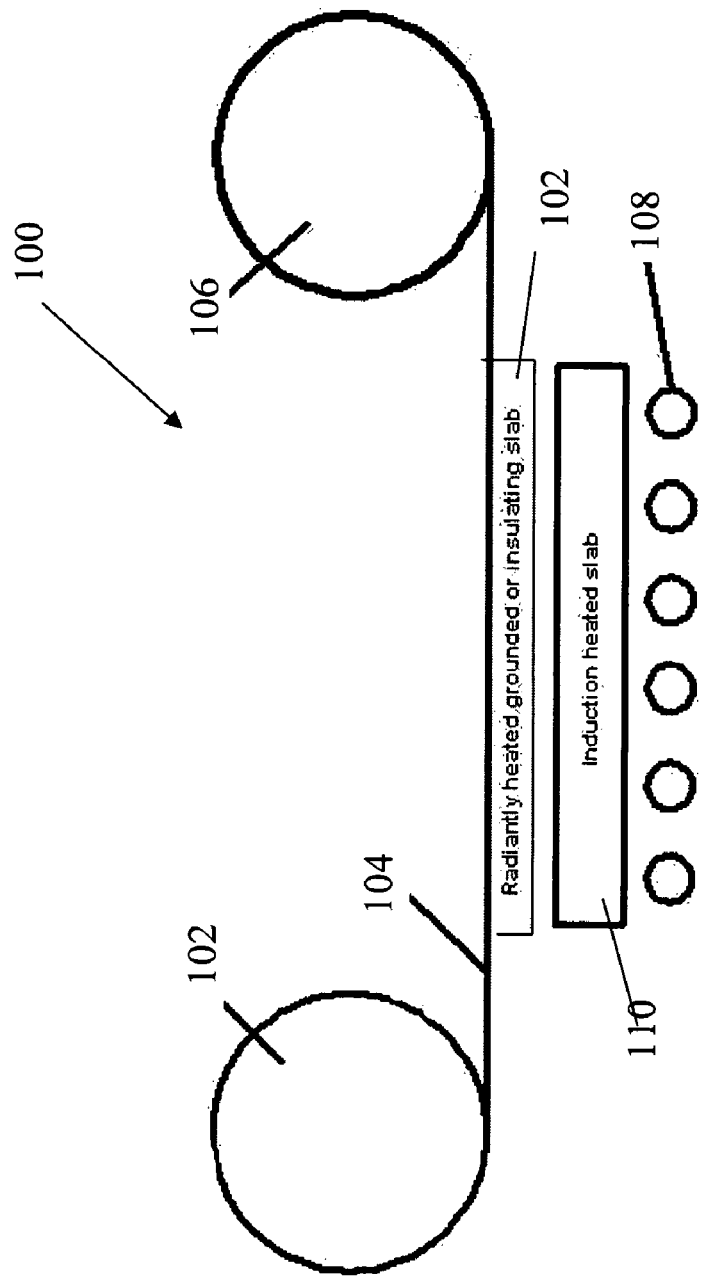
FIG. 7 illustrates a tape deposition system of the present invention

The present invention is not limited to CVD systems using substrates mounted on a susceptor. The present invention may be utilized in CVD apparatus that deposits materials on a continuous tape or roll. Such systems have been problematic for use with induction heaters because of the need to electrically ground the tape which will limit the effectiveness of the generation of eddy currents. Further, effectively heating a moving tape uniformly for chemical vapor deposition can be extremely difficult, where as direct contact of a tape with a heated surface better defines the heated deposition zone. FIG. 7 illustrates a tape deposition system 100 including a feed roll 102 feeding a continuous roll of tape 104 for deposition, to a take up roll 106. Idlers or tensioners that may be interposed in the tape path to improve drive performance are not shown. An induction heating coil 108 is used to heat a metallic platen 110 by the induction of eddy currents therein. The heat generated in platen 90 is radiated to a slab 112 over which tape 104 passes. Slab 102, which is analogous to the susceptor in the previously described embodiments, because it is heated by radiated heat from the platen, not by eddy currents, can be either insulating or electrically grounded, which provides an effective deposition process across a continuous tape.

The invention has been described with respect to preferred embodiments for film deposition on a wafer surface or heated substrate. However, as those skilled in the art will recognize, modifications and variations in the specific details which have been described and illustrated may be resorted to without departing from the spirit and scope of the invention as defined in the appended claims. For example, similar problems are experienced in reactors wherein the wafer substrate assembly rotates using planetary rotation or where the wafer substrate assembly is not rotated at all. The orientation of the assembly can be of any angle. The number and distribution of heating coils below the filament platen may be varied in number. Any suitable anti levitation system may also be utilized The CVD systems described herein may also include a purging system to purge elements effused from the RF heated platen into the flowing gas stream away from the depositing film surface to prevent backside deposition or to purge areas to minimize contamination.

What is claimed is:

1. A RF heating system for a substrate comprising:
   a) a susceptor for supporting said substrate;
   b) at least one RF heating coil; and
   c) a platen interposed between said RF heating coil and said substrate, said platen being separate from said susceptor and spaced apart therefrom, said interposed platen being constructed of materials that will become heated under RF energy and arranged so as to radiate heat to said susceptor and said substrate.

2. The RF heating system as claimed in claim 1, wherein said susceptor supports multiple substrates.

3. The RF heating system as claimed in claim 1, wherein said susceptor is rotatable by means of a rotating shaft.

4. The RF heating system as claimed in claim 3, wherein said platen includes an opening through which said rotating shaft passes.

5. The RF heating system as claimed in claim 1, wherein said susceptor is comprised of electrically insulating material.

6. The RF heating system as claimed in claim 1, further including a plurality of RF coils having differing operating characteristics.

7. The RF heating system as claimed in claim 1, further including at least one resistive heating coil.

8. The RF heating system as claimed in claim 1, further including a dielectric plate located between said susceptor and said platen.

9. The RF heating system as claimed in claim 1, further including a system to purge elements effused from the RF heated platen, into the flowing gas stream, away from the depositing film surface.

10. The RF heating system as claimed in claim 1 wherein said susceptor is made of diamond for maximum thermal conductivity.

11. The RF heating system as claimed in claim 10, wherein said susceptor is rotatable by means of a rotating shaft.

12. The RF heating system as claimed in claim 10, further including a dielectric plate interposed between said susceptor and said platen.

13. The RF heating system as claimed in claim 10, further including at least one resistive heating coil.

14. A RF heating system for at least one substrate comprising:
   a) a susceptor for supporting said at least one substrate, said susceptor being constructed from electrically insulating material;
   b) at least one RF heating coil; and
   c) a platen interposed between said RF heating coil and said substrate, said interposed platen being spaced away and separate from said susceptor and constructed of materials that will become heated under RF energy, said interposed platen arranged so as to radiate heat to said susceptor and said supported at least one substrate;
   d) a dielectric plate interposed between said RF heating coil and said platen to provide a thermal barrier between the heated platen and the RF heating coil.

* * * * *